United States Patent
Reiss et al.

(10) Patent No.: US 7,265,441 B2
(45) Date of Patent: Sep. 4, 2007

(54) STACKABLE SINGLE PACKAGE AND STACKED MULTI-CHIP ASSEMBLY

(75) Inventors: Werner Reiss, Bad Feilnbach (DE); Wolfgang Hetzel, Nattheim (DE)

(73) Assignee: Infineon Technologies AG, Munich (DE)

( * ) Notice: Subject to any disclaimer, the term of this patent is extended or adjusted under 35 U.S.C. 154(b) by 199 days.

(21) Appl. No.: 11/204,281

(22) Filed: Aug. 15, 2005

(65) Prior Publication Data
US 2007/0035006 A1 Feb. 15, 2007

(51) Int. Cl.
*H01L 23/02* (2006.01)
*H01L 21/00* (2006.01)

(52) U.S. Cl. ............... 257/685; 257/686; 257/E25.006; 257/E25.013; 257/E25.018; 257/E25.021; 257/E25.027; 257/E23.085; 257/E25.614; 438/109

(58) Field of Classification Search ........ 257/685, 257/686, E25.006, E25.013, E25.018, E25.021, 257/E25.027, E23.085, E25.614; 438/109, 438/FOR. 368, FOR. 426
See application file for complete search history.

(56) References Cited

U.S. PATENT DOCUMENTS

| | | | |
|---|---|---|---|
| 6,468,831 B2 * | 10/2002 | Leong et al. | 438/108 |
| 6,750,545 B1 * | 6/2004 | Lee et al. | 257/777 |
| 6,876,088 B2 * | 4/2005 | Harvey | 257/778 |
| 6,906,407 B2 * | 6/2005 | Byers et al. | 257/686 |
| 6,927,484 B2 | 8/2005 | Thomas et al. | |
| 6,960,827 B2 * | 11/2005 | Nishimura et al. | 257/723 |
| 2003/0159773 A1 | 8/2003 | Tomiyama et al. | |
| 2005/0064630 A1 | 3/2005 | Zacherl et al. | |
| 2007/0040261 A1 * | 2/2007 | Hetzel et al. | 257/686 |

FOREIGN PATENT DOCUMENTS

| | | |
|---|---|---|
| DE | 102 01 204 A1 | 7/2003 |
| DE | 102 51 530 A1 | 5/2004 |

* cited by examiner

*Primary Examiner*—Jasmine Clark
(74) *Attorney, Agent, or Firm*—Slater & Mitsil, L.L.P.

(57) ABSTRACT

A stackable packaged chip includes a substrate with a conductive wiring formed therein or thereon. The substrate further includes a plurality of substrate contact pads arranged around a periphery portion of the substrate. A chip mounted on the substrate including contact pads that are electrically connected with the conductive wiring of the substrate, and a ring surrounding edges of the chip are also included. The ring is formed from an electrically insulating material and includes a plurality of openings, each opening adjacent a substrate contact pad to allow for electrical connection to the chip though the substrate contact pad.

20 Claims, 4 Drawing Sheets

STACKABLE SINGLE PACKAGE AND STACKED MULTI-CHIP ASSEMBLY

TECHNICAL FIELD

The invention relates generally to packaged components and in particular embodiments to a stackable single package and a stacked multi-chip assembly.

BACKGROUND

There are many well-known microelectronic packages with stacked chips within a housing, e.g., made of a mold compound. The chips, also called silicon dies, are stacked face up or face down with an adhesive and are electrically connected with a base substrate via wire loops. An example of a stacked chip assembly on a substrate is known from U.S. Patent Publication No. 2003/0159773 A1, which is incorporated herein by reference. There are chips with different dimensions mounted one over another such that the chip with the smaller dimensions is mounted on a chip with larger dimensions. Between the chips is arranged an adhesive. A chip with smaller dimensions must be mounted on a base chip because the rim portion of the base chip is provided with bond pads for electrical connections. These bond pads are connected with contact pads on the substrate with wire loops.

It seems to be clear that the necessity of chips with different dimensions leads to more costs for the assembling process since the mounting tools must be able to mount chips with different outer dimensions.

It is also well-known to realize a stack of individual chips with equal dimensions on a substrate with a spacer between the chips. The first chip is mounted on the substrate by chip bonding with an adhesive or a tape and then a spacer with smaller dimensions is mounted on the first chip. The spacer must have smaller dimensions than the first chip. Then a second chip with equal dimensions is mounted on the spacer and so on. At least the several chips are connected to the substrate with wire loops. Such wire loops are realized with a wire-bonding tool. Alternatively, the wire loops can be performed after each chip bond process.

Such a stack of chips has a comparatively big height, which is contrary to the recent development to produce chip assemblies with a very low height. The reason for the big height are the spacers between the stacked chips. These spacers must have a thickness sufficient to realize a space between the chips, which allows wire bonding, or which secures that the realized wire bond loop does not have the risk for a shortcut to the chip mounted above the lower chip.

A similar stack for a memory module is described in the German laid open application DE 102 51 530 A1 and counterpart U.S. Pat. No. 6,927,484, both of which are incorporated herein by reference. The stacked chips each are provided with two center rows of bond pads and reroute layers to the rim part. Each bond pad is connected with an appropriate reroute layer by a wire loop. A first chip is die bonded on a substrate face up. The central part of the chip is provided with a mold compound with an upper flat surface for mounting a second chip by chip bonding with an adhesive tape. This chip has the same construction as the first chip. Each reroute layer of the chips is connected with the metallization of the substrate (copper wiring) by wire loops. Finally the stacked die assembly is covered by a mold compound such that a housing is the result.

The total height of such assemblies can be reduced in limitations by thinning the chips before assembling them in a stack but this produces the risk of silicon chip damages during transportation and test handling and assembling on bare chip package construction. Especially the edges of the chips are very sensitive.

From the German laid open application DE 102 01 204 A1, and counterpart U.S. Patent Publication No. 2005/0064630, both of which are incorporated herein by reference, a means for protecting the edges of a bare chip after assembling on a substrate is known. An encapsulant encloses the edges of the silicon chip thereby protecting the edges of the chip from mechanically caused damages. This is not suitable for protecting the chip during handling on the assembling process. Also, it is not possible to use the encapsulant as a carrier for contact elements or a reroute layer.

SUMMARY OF THE INVENTION

Embodiments of the invention concern the field of microelectronic packages with a substrate as a base carrier for a stack of chips that is provided with a copper wiring for electrically connecting the chips with the substrate as well as for assembling the substrate by way of solder balls on a printed circuit. To realize a high density of functions under small dimensions, some or all chips within the package are stacked one over another and are electrically connected both with one another as well as with the substrate.

In one aspect, the invention realizes a microelectronic package with stacked multi-chip assemblies that have a smaller height than similar assemblies known from the prior art.

In another aspect, the invention prevents any risk of damages during handling procedures of the chips during the assembling process.

In yet another aspect, the invention simplifies the assembling process and increases the reliability of the microelectronic package by eliminating any wire bond process.

In a further aspect, the invention realizes a stacked chip assembly without the necessity of any additional housing.

In yet a further aspect, the invention realizes interconnections between the stacked chips and the wiring of a substrate without or with a minimum of wire bonding.

According to embodiments of the invention, a stackable single package includes a substrate with a copper wiring on one of its sides. A chip is mounted on the substrate by die bonding and electrical connections are made between bond pads on the chip and the copper wiring. A mold ring surrounds the edges of the chip, contact pads at the chip side surface on the substrate and facilitates electrical connection with the wiring on the substrate. The contact pads are distributed or arranged over the rim portion of the chip. A number of holes in the mold ring adjacent to each contact pad on the substrate is suitable for receiving a contact means.

The mold ring could consist of a mold compound wherein the holes are oblong holes or fingers.

The holes are preferably filled with a solder paste or a solder glue to be connected with contact pads of another single package.

Further, the holes or oblong holes are suitable for receiving small contact balls connectable with the contact pad and the thickness of the mold ring should be at least equal to the thickness of the chip.

Stacked package assembly with a lot of stackable single packages stacked one over another wherein the contact pads of each single package of the stacked package are electrically connected with one another via a solderable solder paste.

In another embodiment, the contact pads of each single package of the stacked package are electrically connected with one another via solderable micro balls.

The stacking construction according to embodiments of the described invention can be used for all xBGA construction (substrate, foil, wire bond, lead bond, etc.).

Moreover, the mold ring enables the stacked assembly to be very thin.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

Figure 1:
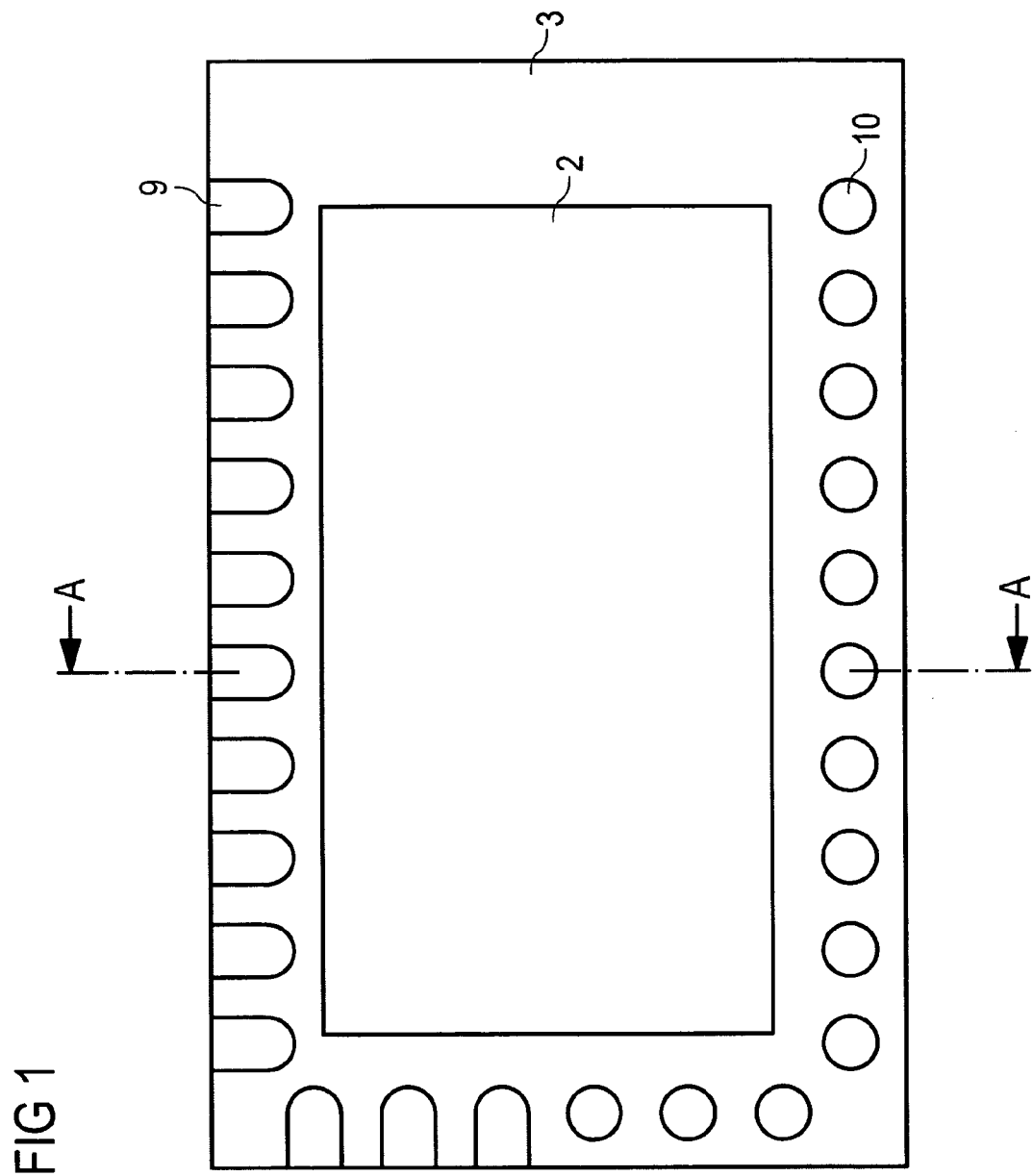
FIG. 1 shows a package top view.

FIG. 1 illustrates a schematic top view of a single package 1 according to embodiments of the invention. The core of the single package 1 is a chip 2, also called a die, surrounded by a mold ring 3.

Figure 2:
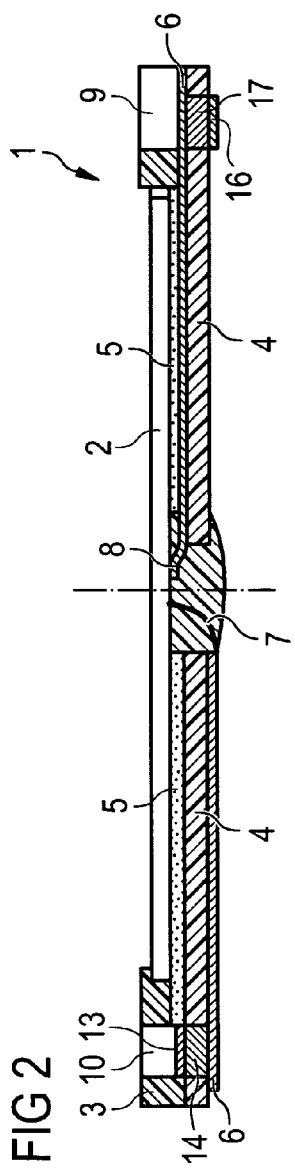
FIG. 2 is a schematic cross-section through a single package along the line A-A in FIG. 1 before stacking illustrating electrical connection elements in each level.

The mold ring 3 has at least two functions, which are first protecting the corner and edge of the chip 2 and second it serves as a means to realize electrical interconnections between stacked single package 1 chips as will be explained later. Referring also to FIG. 2, the chip 2 is mounted on a substrate 4 by die bonding with an adhesive tape 5. The substrate 4 (e.g., single layer substrate) is provided with a copper wiring 6 either on the surface opposite to the chip 2 mounting side or on the chip 2 mounting side.

Therefore, the left side of FIG. 2 illustrates a wiring 6 on the side opposite the chip 2 mounting side. In this case the wiring 6 of the substrate 4 is connected with respective bond pads on the chip 2 with wire loops 7 performed by well-known technology of wire bonding. The wire loops 7 extends through a central opening in the substrate 4.

The right side of FIG. 2 illustrates another embodiment. In this case the necessary contact between the bond pads on the chip 2 and the wiring 6 on the substrate 4 is performed with ends 8 of the wiring protruding from the substrate 4 into a central opening in the substrate direct to the respective bond pads on the chip 2. The protruding ends 8 are electrically connected with the bond pads on the chip 2 by one of the well-known methods of thermo compression bonding, thermosonic bonding or ultrasonic bonding.

The wire loops 7 or the protruding ends 8 are used only for the internal electrical connection between the chip 2 and the copper wiring 6 on the substrate 4. The central opening in the substrate 4 is filled with a mold compound or similar to protect the wire loop 7 or the protruding end 8 later.

The other ends of the wiring 6 extend on the surface of the substrate 4 until under the mold ring 3 surrounding the chip 2 as best seen in FIG. 2.

From the top view according to FIG. 1, it can be seen that the mold ring 3 is provided with oblong holes or fingers 9 and with holes 10 for stacking and for realizing the necessary electrical interconnections between each single package 1 of the stack.

Figure 3:
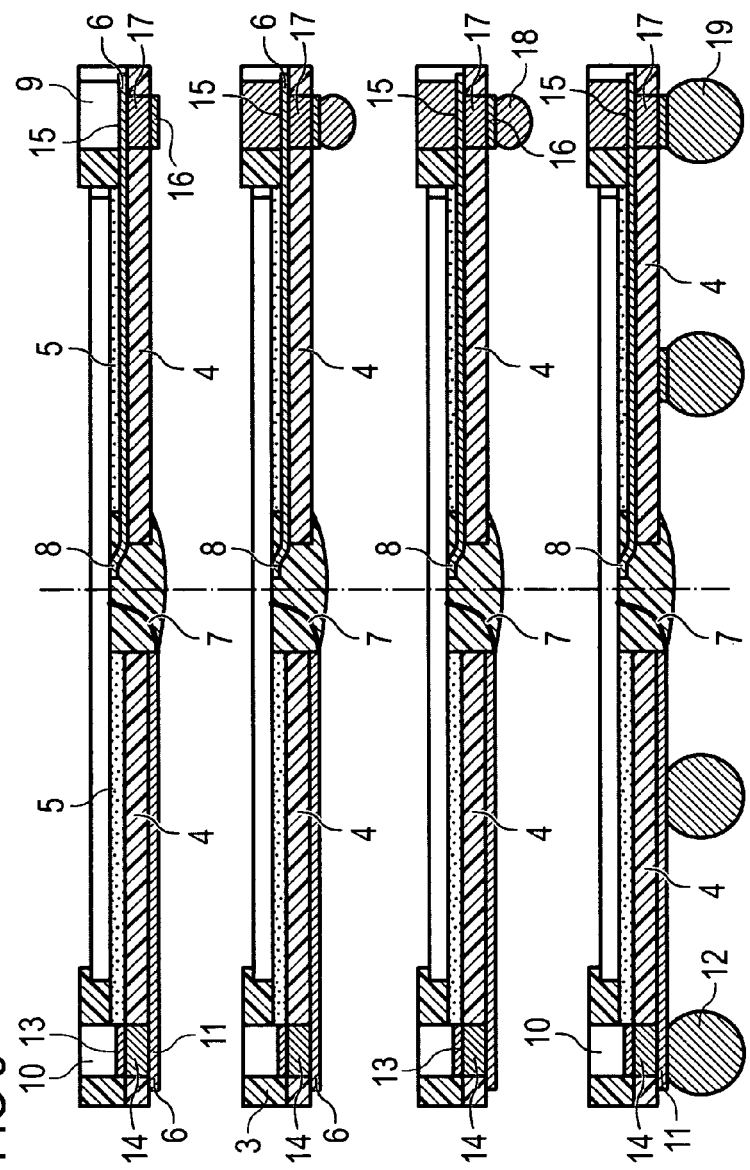
FIG. 3 illustrates four single packages in a schematic cross-section along the line A-A in FIG. 1 positioned one over another before assembling to a stack.

The electrical interconnections can be performed different ways as can be seen from FIGS. 2 and 3 left and right sides.

On the left side of FIGS. 2 and 3, the copper wiring 6 is positioned on the substrate at the side opposite the chip side and ends at a ball pad 11 as a base for a ball 12. At the opposite side of the substrate 4 is arranged a contact pad 13 adjacent the ball pad 11. Both pads 11, 13 are connected with one another over a via 14 within the substrate 4 filled with a metal, preferably copper. Over the contact pad 13 exists the hole 10 in the mold ring 3 to realize a further contact to another stacked single package 1. FIG. 3 shows the assembly before stacking and FIG. 4 after stacking.

The hole 10 is filled with a solder paste, a solder glue or another suitable connecting material by printing, dispensing or another suitable method. The electrical connection and assembling procedure can be performed by soldering with a temperature treatment in a reflow oven. The result is illustrated in FIG. 4 (left side).

Another way for the electrical interconnection can be seen from FIGS. 2 and 3 right sides. There the copper wiring 6 is positioned on the substrate 4 at the chip side and ends at a contact pad 15. On the opposite side of the substrate 4 is positioned a ball pad 16 adjacent the contact pad 15. Both pads 15, 16 are connected with one another over a via 17 in the substrate 4 filled with a metal, preferably copper.

Figure 4:
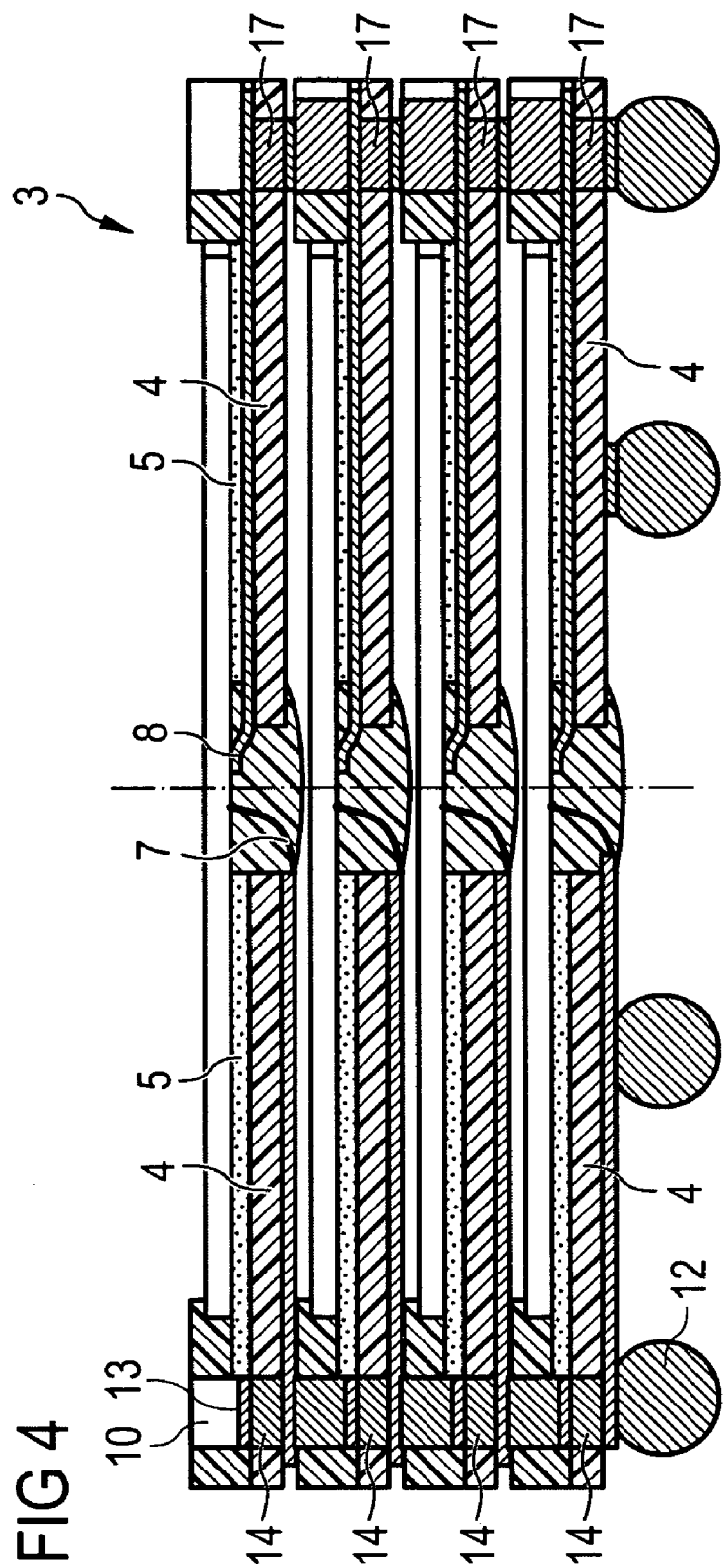
FIG. 4 illustrates a stacked package with a mold ring and electrical connections between the levels performed with solder balls or solder paste.

Over the contact pad 13 exists the oblong hole or finger 9 in the mold ring 3 to realize a further contact to another stacked single package 1 according to FIG. 3 (right side) before stacking, and FIG. 4 (right side) after stacking. On the ball pad 16 of each single package 1, which is to stack at an other single package 1, is mounted a small contact ball 18, which is to insert into the oblong hole or finger 9 during stacking. Then the electrical connection and assembling can be performed by soldering with temperature treatment in a reflow oven. The result is illustrated in FIG. 4 (right side).

As can be seen from FIGS. 3 and 4 the lower single package 1 is provided with contact balls 19 at the side of the substrate 4 opposite the chip side so that the stacked assembly can be soldered at a suitable printed circuit board (not shown).

Figure 5:
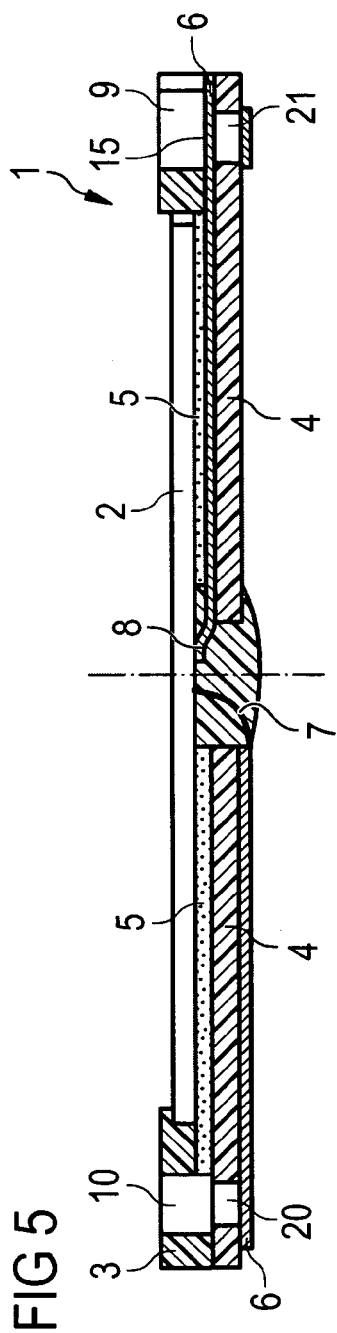
FIG. 5 illustrates a schematic cross-section through a single package with a single layer substrate similar to the single package shown in FIG. 2.
Figure 6:
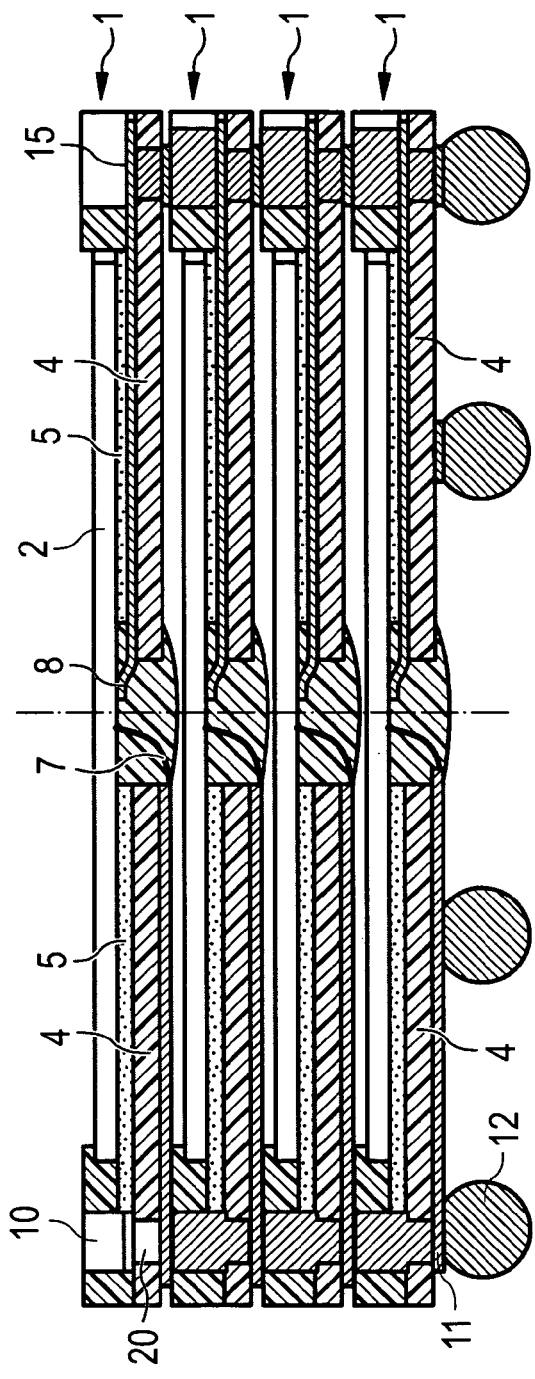
FIG. 6 illustrates a stacked package with single packages according FIG. 5.

A special embodiment is illustrated in FIGS. 5 and 6 with a single layer substrate that corresponds to the embodiment shown in FIG. 2, left and right sides.

The left side of FIG. 5 illustrates a wiring 6 on the side opposite the chip 2 mounting side. In this case, the wiring 6 of the substrate 4 is connected with respective bond pads on the chip 2 with wire loops 7 through a central opening in the substrate. This opening is filled with a mold compound or similar later to protect the electrical connections. The wire loops 7 are performed by well-known technology of wire bonding.

The right side of FIG. 5 illustrates another embodiment. In this case the necessary contact between the bond pads on the chip 2 and the wiring 6 on the substrate 4 is performed with ends 8 of the wiring protruding from the substrate 4 into the central opening of the substrate 4 direct to the respective bond pads on the chip 2. The protruding ends 8 are electrically connected with the bond pads on the chip 2 by one of the well-known methods of thermo compression bonding, thermosonic bonding or ultrasonic bonding. This central opening in the substrate 4 is filled with a mold compound or similar later to protect the electrical connections.

The wire loops 7 or the protruding ends 8 are used only for the internal electrical connection between the chip 2 and the copper wiring 6 on the substrate 4.

The other ends of the wiring 6 extend on the surface of the substrate 4 until under the mold ring 3 surrounding the chip 2 as best seen from FIG. 5.

From the top view according to FIG. 1, it can be seen that the mold ring 3 is provided with oblong holes or fingers 9 and with holes 10 for stacking and for realizing the necessary electrical interconnections between each single package 1 of the stack.

The electrical interconnections can be performed different ways as can be seen from FIG. 5, left and right sides.

At the left side of FIG. 5, the copper wiring 6 is positioned on the substrate on the side opposite the chip side and ends at a ball or contact pad 11 as a base for a ball 12 or another contact means. At the opposite side, the substrate 4 is provided with an opening 20 such that the contact pad is freely accessible from both sides. The opening 20 is positioned exactly below the hole 10 in the mold ring.

The hole 10 and the opening 20 are filled with a solder paste, a solder glue or another suitable connecting material by printing, dispensing or another suitable method. The electrical connection and assembling procedure can be performed by soldering with a temperature treatment in a reflow oven. The result is illustrated in FIG. 6 (left side).

Another way for the electrical interconnection can be seen from FIG. 5, right side. There, the copper wiring 6 is positioned on the substrate 4 at the chip side and ends at a contact pad 15. The substrate 4 is provided with an opening 21 opposite the contact pad 15 such that the contact pad 16 is freely accessible from both sides.

Over the contact pad 15 exists the oblong hole or finger 9 in the mold ring 3 to realize a further contact to another stacked single package 1 according to FIG. 5 (right side) before stacking, and FIG. 6 (right side) after stacking.

For stacking, the oblong hole 9 and the opening 21 are filled with a solder paste, a solder glue or another suitable connecting material by printing, dispensing or another suitable method.

Then the electrical connection and assembling can be performed by soldering with temperature treatment in a reflow oven. The result is illustrated in FIG. 6 (right side).

What is claimed is:

1. A stackable packaged chip comprising:
    a substrate with a conductive wiring formed therein or thereon, the substrate further comprising a plurality of substrate contact pads arranged around a periphery portion of the substrate;
    a chip mounted on the substrate, the chip including contact pads that are electrically connected with the conductive wiring of the substrate; and
    a ring surrounding edges of the chip, the ring formed from an electrically insulating material, wherein the ring includes a plurality of openings, each opening adjacent to a substrate contact pad to allow for electrical connection to the chip though the substrate contact pad.

2. The stackable packaged chip according to claim 1, wherein the ring is made of a mold compound.

3. The stackable packaged chip according to claim 1, wherein the openings comprise oblong holes or fingers.

4. The stackable packaged chip according to claim 3, wherein the openings are filled with a solder paste.

5. The stackable packaged chip according to claim 4, wherein the openings are filled with a solder paste to be connected with contact pads of another single package.

6. The stackable packaged chip according to claim 3, wherein the holes are filled with a solder glue.

7. The stackable packaged chip according to claim 3, wherein the openings are suitable for receiving a small contact ball connectable with the substrate contact pad.

8. The stackable packaged chip according to claim 1, wherein the ring has a thickness that is at least equal to a maximum thickness of the chip.

9. The stackable packaged chip according to claim 1, wherein the substrate comprises a single layer substrate that is provided with substrate openings aligned with the openings in the ring, wherein the substrate openings extend to a bottom side of a ball pad and are filled with a solder material thereby forming chip side contact pads on the surface of the substrate.

10. The stackable packaged chip according to claim 1, wherein a chip side contact pad of a single layer substrate under the oblong hole or finger is provided at the opposite side with an opening designated to be filled with solder paste or solder glue thereby forming a contact element protruding through the substrate.

11. The stackable packaged chip according to claim 1, wherein the conductive wiring comprises a copper wiring.

12. The stackable packaged chip according to claim 1, wherein the contact pads of the chip are electrically connected with the conductive wiring of the substrate via wire bonding.

13. A stackable single package comprising a substrate with a copper wiring on one of its sides and a chip mounted on the substrate by die bonding, electrical connections between bond pads on the chip and the copper wiring comprising:
    a mold ring surrounding edges of the chip;
    contact pads at a chip side surface on the substrate, the contact pads being electrically connected with the wiring on the substrate, wherein the contact pads are distributed over a rim portion of the substrate; and
    a multiplicity of holes in the mold ring adjacent to each contact pad on the substrate and suitable for receiving a contact means.

14. A stacked package assembly comprising a plurality of stackable packages stacked one over another, the plurality of stackable packages including at least an upper stackable package and a lower stackable package, each stackable package comprising:
    a substrate with a conductive wiring formed therein or thereon, the substrate further comprising a plurality of substrate contact pads arranged around a periphery portion of the substrate;
    a chip mounted on the substrate, the chip including contact pads that are electrically connected with the conductive wiring of the substrate; and
    a ring surrounding edges of the chip, the ring formed from an electrically insulating material, wherein the ring includes a plurality of openings, each opening adjacent a substrate contact pad;
    wherein the lower stackable package is electrically coupled to the upper stackable package via electrical connections made through the openings in the ring of the lower stackable package.

15. The stacked package assembly according claim 14, wherein the electrical connections made through the openings in the ring are made using solder paste.

16. The stacked package assembly according to claim 14, wherein the electrical connections made through the openings in the ring are made using solderable micro balls.

17. The stacked package assembly according to claim 14, wherein a lowest stackable package includes a bottom surface that includes a plurality of solder balls arranged to be electrically connected to a printed circuit board.

18. A method of making a stacked package assembly, the method comprising:
  providing a first stackable package comprising:
    a substrate with a conductive wiring formed therein or thereon, the substrate further comprising a plurality of substrate contact pads arranged around a periphery portion of the substrate;
    a chip mounted on the substrate, the chip including contact pads that are electrically connected with the conductive wiring of the substrate; and
    a ring surrounding edges of the chip, the ring formed from an electrically insulating material, wherein the ring includes a plurality of openings, each opening adjacent a substrate contact pad;
  providing a second stackable package comprising:
    a substrate with a conductive wiring formed therein or thereon, the substrate further comprising a plurality of substrate contact pads arranged around a periphery portion of the substrate;
    a chip mounted on the substrate, the chip including contact pads that are electrically connected with the conductive wiring of the substrate; and
    a ring surrounding edges of the chip, the ring formed from an electrically insulating material, wherein the ring includes a plurality of openings, each opening adjacent a substrate contact pad; and
  mounting the second stackable package onto the first stackable package, the chip of the second stackable package being electrically coupled to the substrate of the first stackable package through an electrical connection made in an opening in the ring of the first stackable package.

19. The method of claim 18, wherein mounting the second stackable package onto the first stackable package comprises soldering the second stackable package and the first stackable package.

20. The method of claim 18, further comprising:
  providing a third stackable package comprising:
    a substrate with a conductive wiring formed therein or thereon, the substrate further comprising a plurality of substrate contact pads arranged around a periphery portion of the substrate;
    a chip mounted on the substrate, the chip including contact pads that are electrically connected with the conductive wiring of the substrate; and
    a ring surrounding edges of the chip, the ring formed from an electrically insulating material, wherein the ring includes a plurality of openings, each opening adjacent a substrate contact pad; and
  mounting the third stackable package onto the second stackable package, the chip of the third stackable package being electrically coupled to the substrate of the second stackable package through an electrical connection made in an opening in the ring of the second stackable package.

* * * * *